(12) United States Patent
Kim et al.

(10) Patent No.: US 8,183,468 B2
(45) Date of Patent: May 22, 2012

(54) ELECTROMAGNETIC BANDGAP STRUCTURE, PRINTED CIRCUIT BOARD COMPRISING THIS AND METHOD THEREOF

(75) Inventors: Han Kim, Yongin-si (KR); Dae-Hyun Park, Ulsan (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 915 days.

(21) Appl. No.: 12/216,629

(22) Filed: Jul. 8, 2008

(65) Prior Publication Data
US 2009/0015354 A1 Jan. 15, 2009

(30) Foreign Application Priority Data
Jul. 12, 2007 (KR) .................. 10-2007-0070001

(51) Int. Cl.
*H05K 1/11* (2006.01)
(52) U.S. Cl. ........ 174/262; 174/258; 174/260; 174/264; 174/360; 174/376; 361/794; 361/795; 361/818; 343/909; 333/12; 333/212
(58) Field of Classification Search .......... 174/255, 174/260–268, 360, 376
See application file for complete search history.

(56) References Cited

U.S. PATENT DOCUMENTS

| | | | | |
|---|---|---|---|---|
| 5,473,813 A * | 12/1995 | Chobot et al. | .................. | 29/837 |
| 6,353,540 B1 * | 3/2002 | Akiba et al. | .................. | 361/794 |
| 6,552,696 B1 * | 4/2003 | Sievenpiper et al. | ......... | 343/909 |
| 6,628,242 B1 * | 9/2003 | Hacker et al. | .................. | 343/909 |
| 6,992,255 B2 * | 1/2006 | Oprysko et al. | .......... | 174/262 |
| 7,136,029 B2 * | 11/2006 | Ramprasad et al. | .......... | 343/909 |
| 7,215,007 B2 * | 5/2007 | McKinzie et al. | ............ | 257/664 |
| 2002/0180004 A1 * | 12/2002 | Oggioni et al. | ............... | 257/621 |
| 2005/0029632 A1 * | 2/2005 | McKinzie | ..................... | 257/665 |
| 2006/0038639 A1 * | 2/2006 | McKinzie | ..................... | 333/219 |

FOREIGN PATENT DOCUMENTS

| | | |
|---|---|---|
| JP | 5-183328 | 7/1993 |
| JP | 2003-133801 | 5/2003 |

OTHER PUBLICATIONS

Japanese Office Action issued Sep. 21, 2010 in corresponding Japanese Patent Application 2008-177624.

* cited by examiner

*Primary Examiner* — Courtney Smith

(57) ABSTRACT

An electromagnetic bandgap structure and a printed circuit board including it as well as a method of manufacturing thereof that can solve a mixed signal problem between an analog circuit and a digital circuit are disclosed. The electromagnetic bandgap structure in accordance with an embodiment of the present invention can include: a first metal layer; a first dielectric layer, stacked on the first metal layer; a metal plate, stacked on the first dielectric layer; a second dielectric layer, stacked on the metal plate and the first dielectric layer; a second metal layer, stacked on the second dielectric layer; and a via, directed from the metal plate to the first metal layer and the second metal layer. The via can be connected to the first metal layer and is not connected the second metal layer.

8 Claims, 29 Drawing Sheets

660

ELECTROMAGNETIC BANDGAP STRUCTURE, PRINTED CIRCUIT BOARD COMPRISING THIS AND METHOD THEREOF

CROSS-REFERENCE TO RELATED PATENT APPLICATIONS

This application claims the benefit of Korean Patent Application No. 10-2007-0070001, filed on Jul. 12, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to a printed circuit board that can solve a mixed signal problem between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140

If it is assumed that the metal layer represented by reference numeral 110-2 is a ground layer and the metal layer represented by reference numeral 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem of mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem of mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a, a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function of preventing a signal having a certain frequency band from being penetrated, which is based on resistance $R_E$ and $R_P$, inductance $L_E$ and $L_P$, capacitance $C_E$, $C_P$ and $C_G$ and conductance $G_P$ and $G_E$, is approximated to the equivalent circuit shown in FIG. 5.

A mobile communication terminal is a good example of an electronic apparatus employing the board realized with the digital circuit and the RF circuit together. In the case of the mobile communication terminal, the electromagnetic bandgap structure is inserted between the ground layer and the power layer located in a middle layer of a multilayer printed circuit board when the described electromagnetic bandgap structure is applied for solving the problem of mixed signals. This case has a problem that a total process becomes longer by adding an inner layer process and a plating process for inserting the electromagnetic bandgap structure in the manufacturing process of the multi-layer printed circuit board.

SUMMARY OF THE INVENTION

Accordingly, the present invention provides a printed circuit board and manufacturing method of it that the total process does not become longer because of not adding an inner layer process and a plating process in the conventional manufacturing process of the printed circuit board, although an electromagnetic bandgap structure is included.

The present invention also provides an electromagnetic bandgap structure having a new structure that vias are connected in the complete structure.

An aspect of the present invention features an electromagnetic bandgap structure including: a first metal layer; a first dielectric layer, stacked on the first metal layer; a metal plate, stacked on the first dielectric layer; a second dielectric layer, stacked on the metal plate and the first dielectric layer; a second metal layer, stacked on the second dielectric layer; and a via, directed from the metal plate to the first metal layer and the second metal layer. The via can be connected to the first metal layer and not connected the second metal layer.

The second metal layer can include a clearance hole that has a same center as the via and has a lager diameter than the via. The via can be connected to a via land on a same planar surface as the second metal layer and the clearance hole can house the via land.

There can be at least one metal layer outside the first metal layer and the second metal layer, and the via can be extended to the metal layer and pass through the inside of a clearance hole formed on the metal layer.

Another aspect of the present invention features a printed circuit board having an analog circuit and a digital circuit. The printed circuit board in which an electromagnetic bandgap structure can be disposed between the analog circuit and the digital circuit. The electromagnetic bandgap structure can include: a first metal layer; a first dielectric layer, stacked on the first metal layer; a metal plate, stacked on the first dielectric layer; a second dielectric layer, stacked on the metal plate and the first dielectric layer; a second metal layer, stacked on the second dielectric layer; and a via, directed from the metal plate to the first metal layer and the second metal layer. The via can be connected to the first metal layer and not connected the second metal layer.

The first metal layer can be any one of a ground layer and a power layer, and the second metal layer can be the other of the ground layer and the power layer. The analog circuit can be an RF circuit receiving a wireless signal from the outside.

The second metal layer can include a clearance hole that has a same center as the via and has a lager diameter than the via. The via can be connected to a via land on a same planar surface as the second metal layer and the clearance hole can house the via land.

There can be at least one metal layer outside the first metal layer and the second metal layer. The via can be extended to the metal layer and pass through the inside of a clearance hole formed on the metal layer.

Another aspect of the present invention features a method of manufacturing a printed circuit board including an electromagnetic bandgap structure. The method in accordance with an embodiment of the present invention can include: patterning a metal plate on a location of a prepared CCL (copper clad laminate); stacking an insulated layer and a metal layer on one or both surfaces of the CCL; patterning a clearance hole on a location of the metal layer corresponding to the metal plate; forming a through hole by drilling a center of the clearance hole; plating the through hole; and forming an external layer circuit.

The method can also include filling an inside of the through hole after the step of plating the through hole. In the step of patterning the clearance hole, a via land can be patterned inside the clearance hole. In the step of forming the through hole, the through hole can be formed by drilling a center of the via land.

BRIEF DESCRIPTION OF THE DRAWINGS

These and other features, aspects and advantages of the present invention will become better understood with regard to the following description, appended Claims and accompanying drawings where:

FIGS. 6a to 6m are sectional views according to a manufacturing process of a printed circuit board including the conventional electromagnetic bandgap structure;

FIGS. 8a to 8j are sectional views according to a manufacturing process of a printed circuit board including the electromagnetic bandgap structure according to an embodiment of the present invention.

DESCRIPTION OF THE EMBODIMENTS

Figure 1:
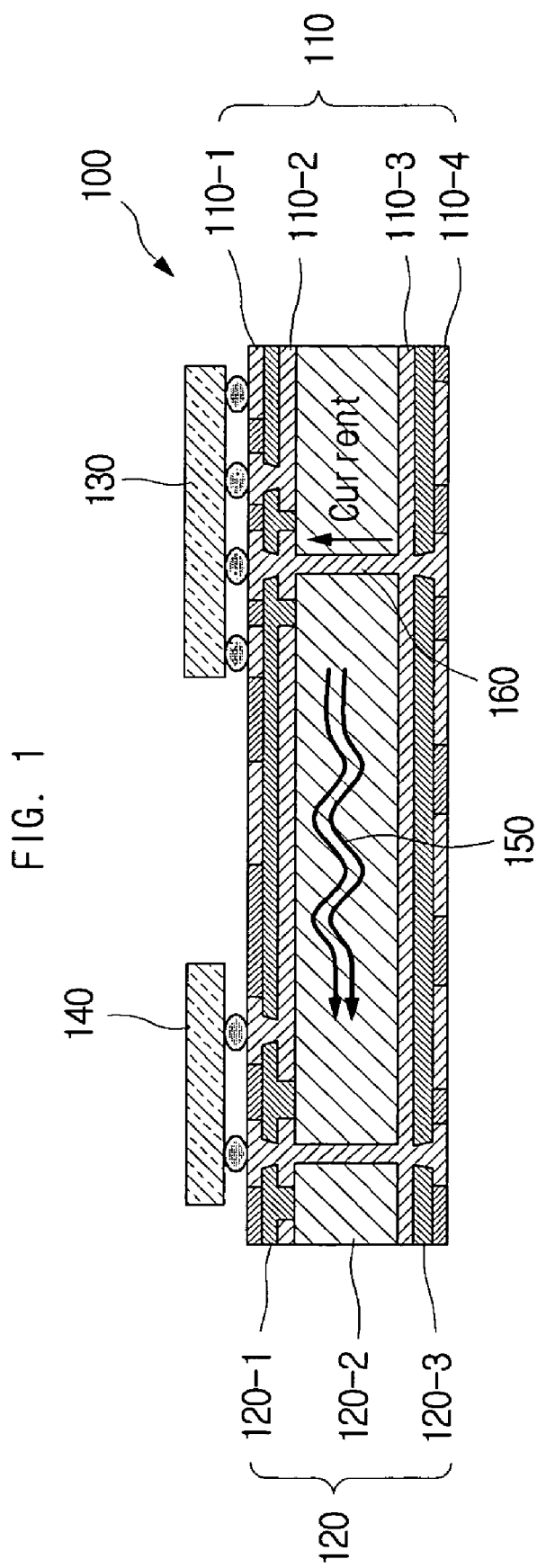
FIG. 1 is a sectional view showing a printed circuit board including an analog circuit and a digital circuit.
Figure 2:
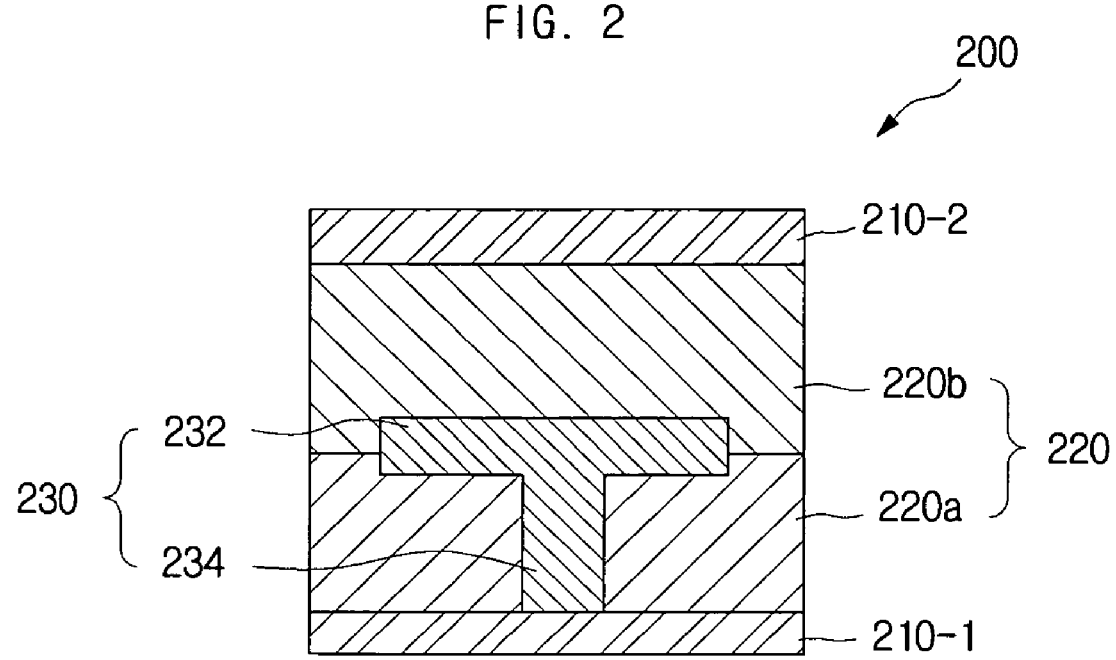
FIG. 2 is a sectional view showing an electromagnetic bandgap structure that solves a problem of mixed signals between an analog circuit and a digital circuit in accordance with a conventional art.
Figure 3:
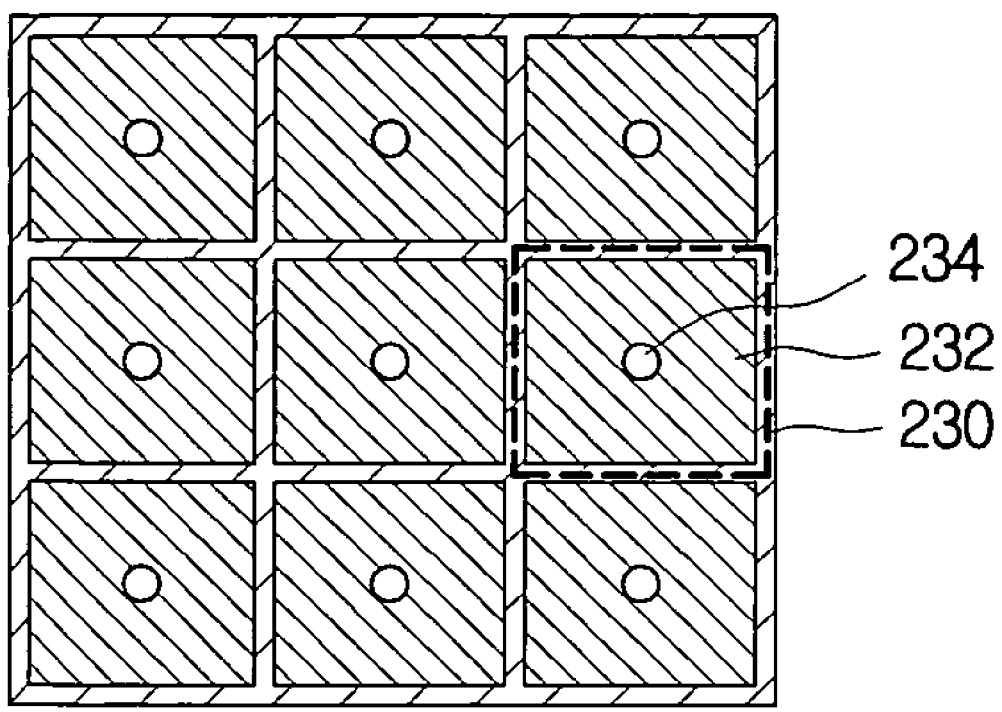
FIG. 3 is a plan view showing a metal plate configuration of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 4:
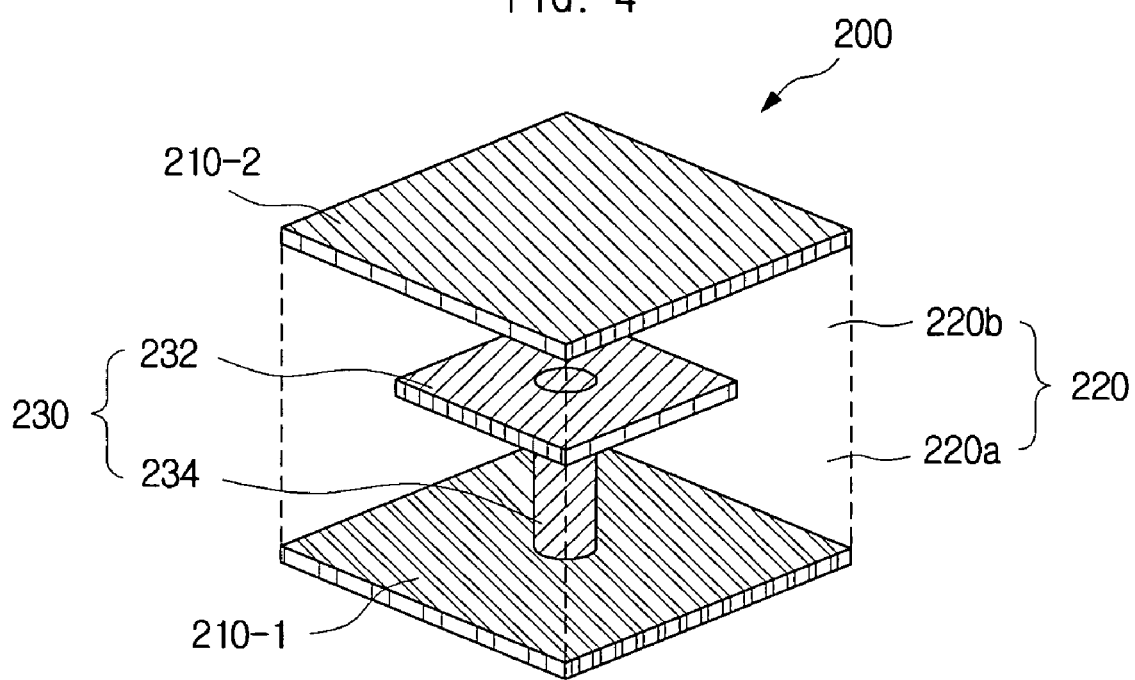
FIG. 4 is a perspective view showing the electromagnetic bandgap structure shown in FIG. 2.
Figure 5:
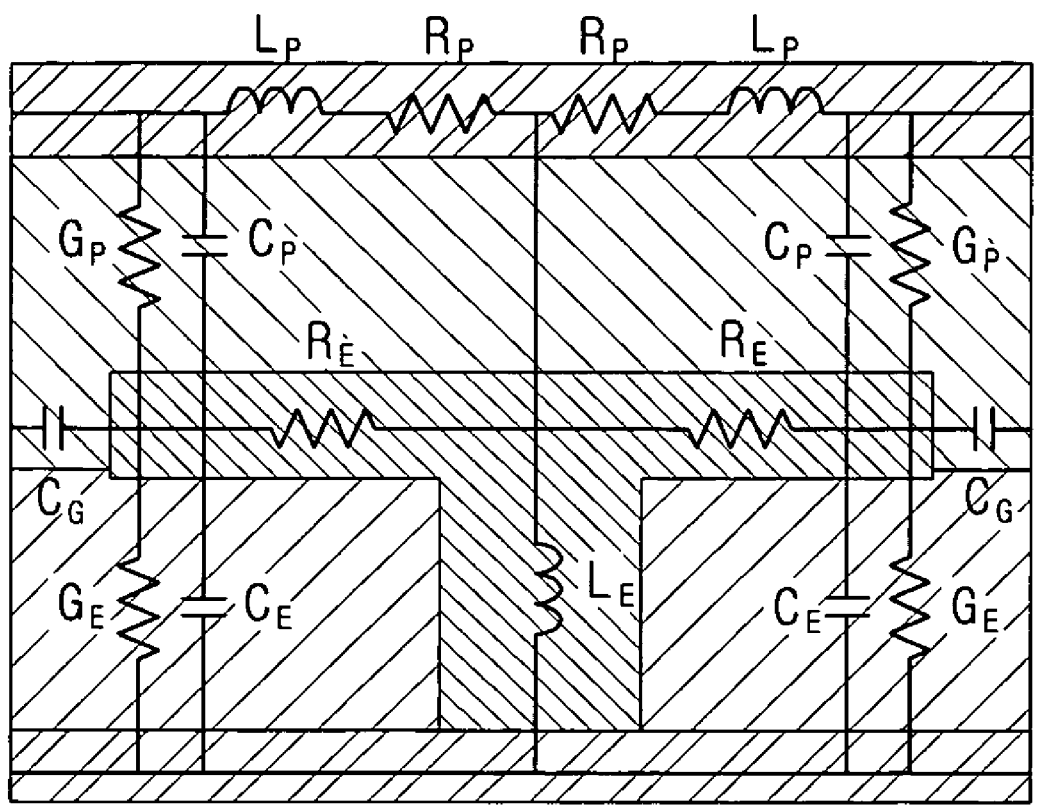
FIG. 5 is a schematic view showing an equivalent circuit of the electromagnetic bandgap structure shown in FIG. 2.

First, referring to FIGS. 6a to 6m, a manufacturing process of a printed circuit board including the electromagnetic bandgap structure 200 illustrated in FIG. 4 is described and then, an electromagnetic bandgap structure according to an embodiment of the present invention and a manufacturing process of a printed circuit board including it will be described.

FIGS. 6a to 6m are sectional views according to a manufacturing process of a printed circuit board including the conventional electromagnetic bandgap structure. Although an 8-layered printed circuit board is described, it is apparent that the same pertinent description can be applied to various printed circuit boards such as 4- and 6-layered printed circuit boards.

Figure 6A:
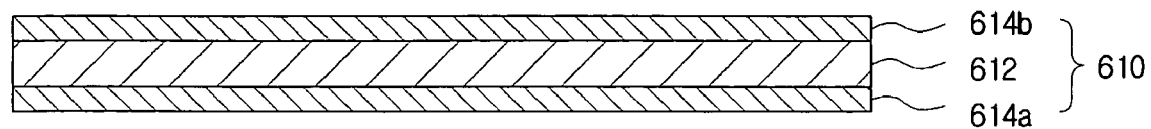

A CCL (cooper clad laminate) 610 is prepared (refer to FIG. 6a). The CCL 610 has cooper films 614a and 614b stacked on both surfaces of an insulated layer 612. Here, it is assumed that a first metal layer 210-1 of the electromagnetic bandgap structure 200 is formed by a lower copper film 614a, and a second metal layer 210-2 of the electromagnetic bandgap structure 200 is formed by an upper copper film 614b.

Figure 6B:
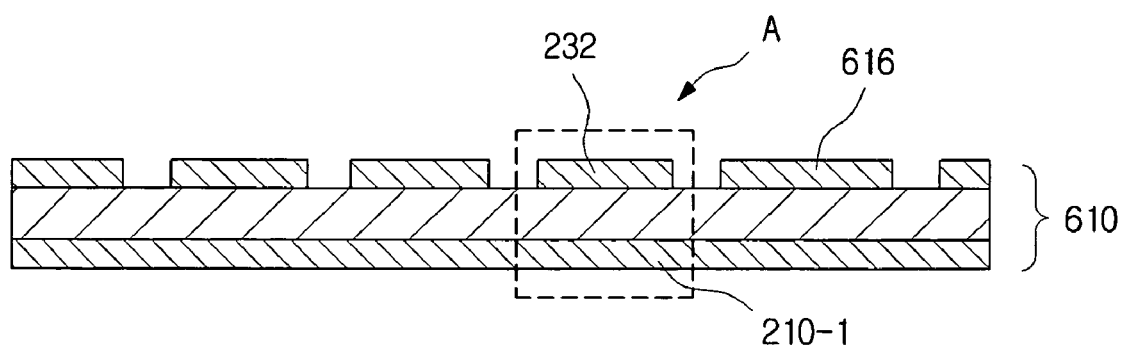

A circuit pattern 616 is formed by dry-etching or wet-etching on one or both surfaces of the CCL 610 (refer to FIG. 6b). After a part of the cooper film 614b stacked on the CCL 610 is eliminated, remained part of it performs a function of the circuit pattern 616. At this time, a metal plate 232 of the electromagnetic bandgap structure 200 is also formed (refer to A).

The circuit pattern 616 and the metal plate 232 are formed through a pattering method (i.e. masking, etching, exposure to light and developing) of a manufacturing process of the printed circuit board. This is a typical process of the printed circuit board and is apparent to anyone skilled in the art, and thus no detailed description thereof will be provided herein.

Figure 6C:
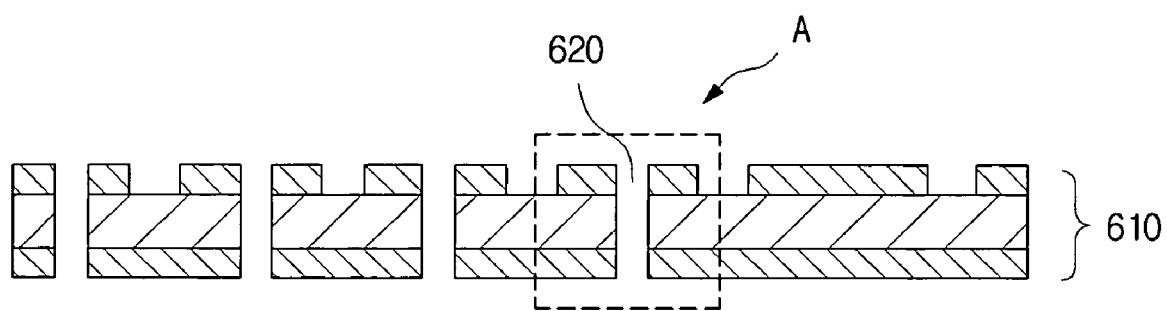

Then, an inner layer through hole 620 that passes through the metal plate 232 and the copper film 614a stacked on a lower surface of the CCL 610 is formed in order to form the via 234 of the electromagnetic bandgap structure 200 (refer to FIG. 6c). Forming the inner layer through hole 620 is performed by machine drilling, laser drilling and so on.

Figure 6D:
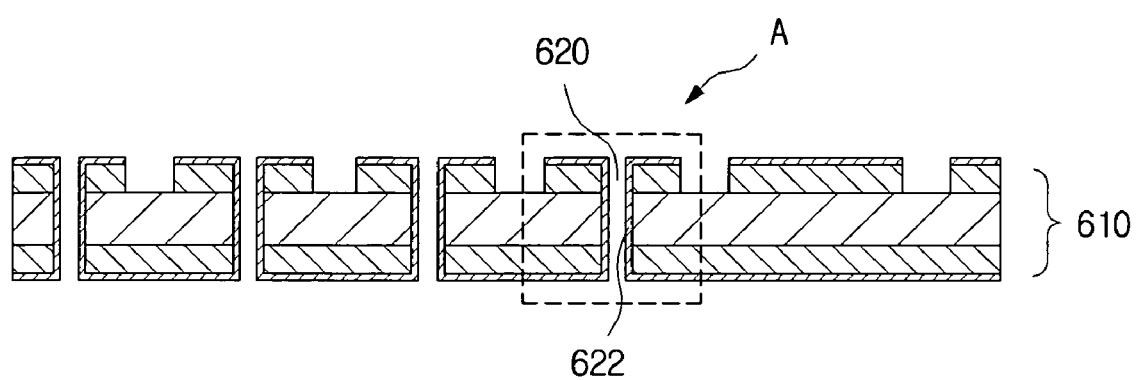

And, a plated layer 622 is formed on an inner wall of the inner layer through hole 620 to electrically connect the lower surface cooper film 614a and upper surface metal plate 232 through a plating process (refer to A of FIG. 6d). The plating process is performed by electroless cooper plating, electro-cooper plating and so on.

The inner side of the plated inner layer through hole 620 is filled with plugging ink 624. Conductive paste, other than the plugging ink 624, can be filled, or all of the inner side, in addition to the inner side of the plated inner layer through hole 620, can be filled by plating.

Figure 6E:
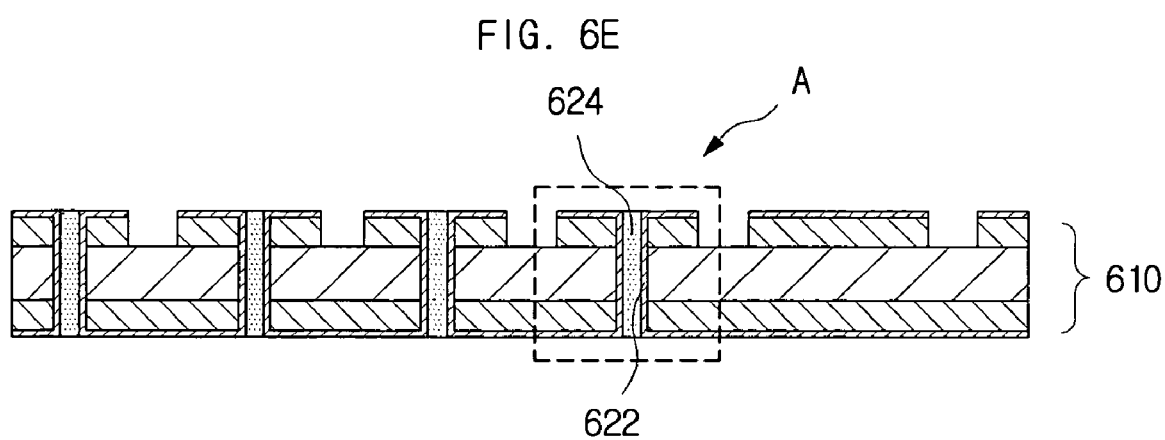

A mushroom type structure 230 of the electromagnetic bandgap structure 200 is formed on the inner layer of the printed circuit board, together with an inner layer circuit, as the inner side of the inner layer through hole 620 is filled (refer to A of FIG. 6e).

Figure 6F:
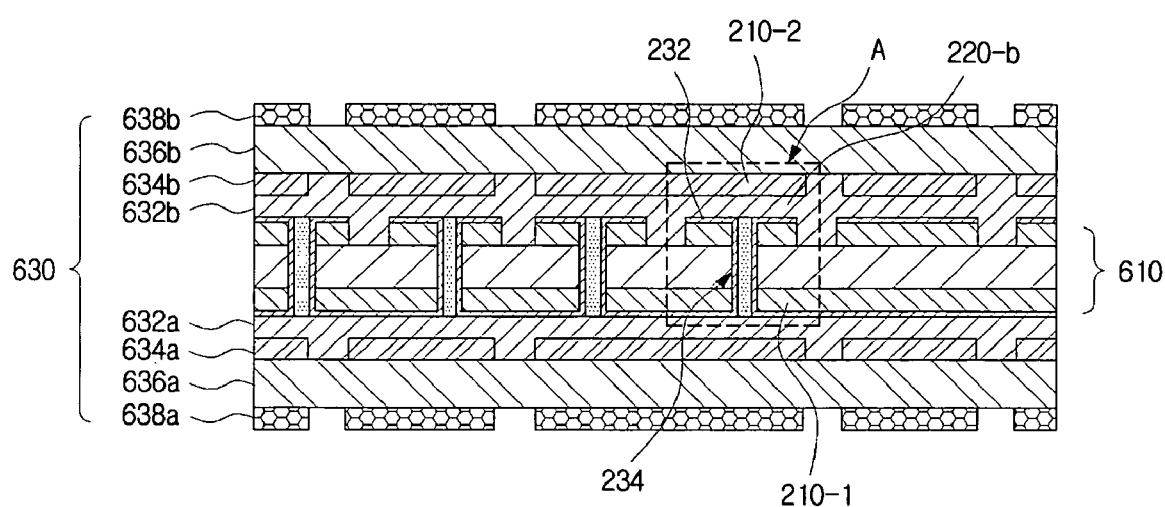

Insulated layers 632a, 632b, 636a and 636b and metal layers 634a, 634b, 638a and 638b are alternately stacked on both surfaces of the inner layer on which the inner layer circuit and the mushroom type structure 230 are formed, by the above-described method, and a circuit pattern is formed on the metal layers 634a, 634b, 638a and 638b as described referring to FIG. 6b (refer to FIG. 6f).

The multi layer printed circuit board 630 includes the mushroom type structure 230 inside the part labeled with A, the insulated layer 220b and the metal layer 210-2 stacked on the metal plate 232 of the mushroom type structure 230, and the electromagnetic bandcap structure including a metal layer 210-1 connected to the mushroom type structure 230 inside.

Figure 6G:
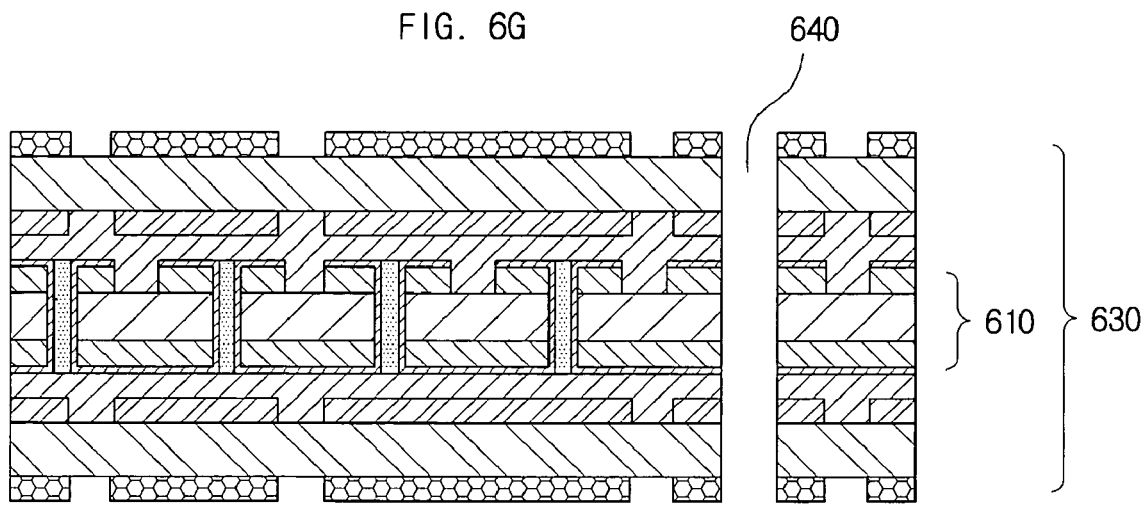

Then, a through hole 640 that passes through the highest metal layer 638b and the lowest metal layer 638a of the multilayer printed circuit board 630 is formed (refer to FIG. 6g). The forming of the through hole 640 is performed by machine drilling, laser drilling and so on, like the forming of the inner layer through hole 640 when the inner layer is formed.

Figure 6H:
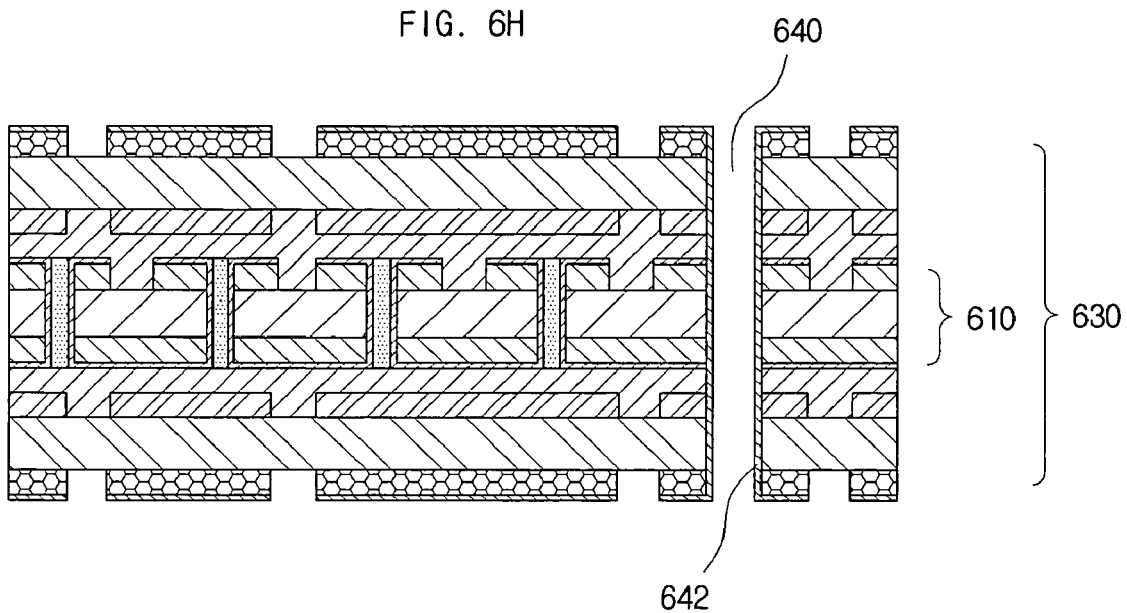
Figure 61:
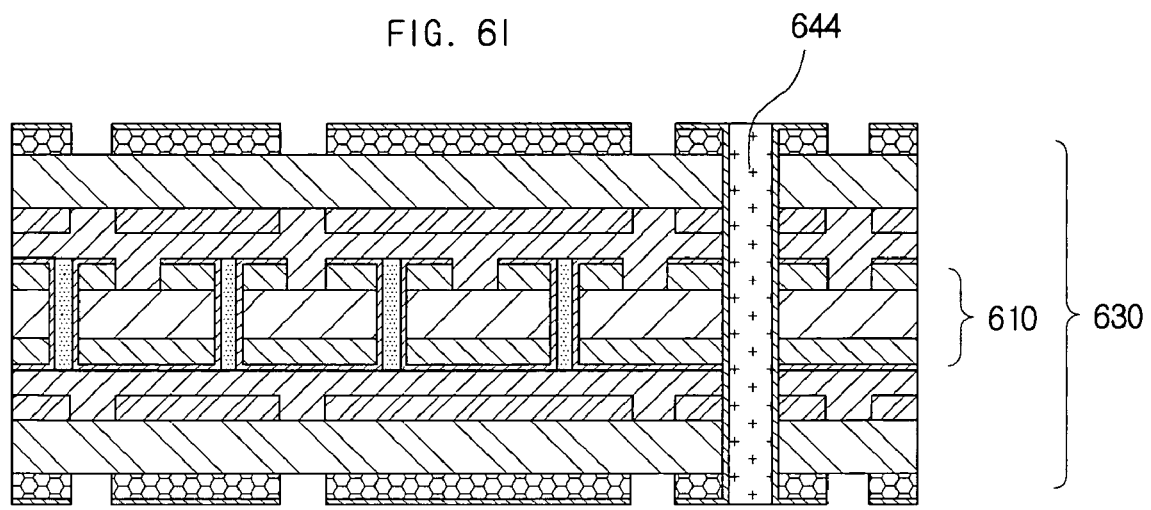

A plated layer 642 is formed on an inner wall of the through hole 640 by plating through electroless cooper plating, electro-cooper plating and so on (refer to FIG. 6h). The empty space inside the trough hole 640 is filled with plugging ink 644, conductive paste and so on (refer to FIG. 6i).

Figure 6J:
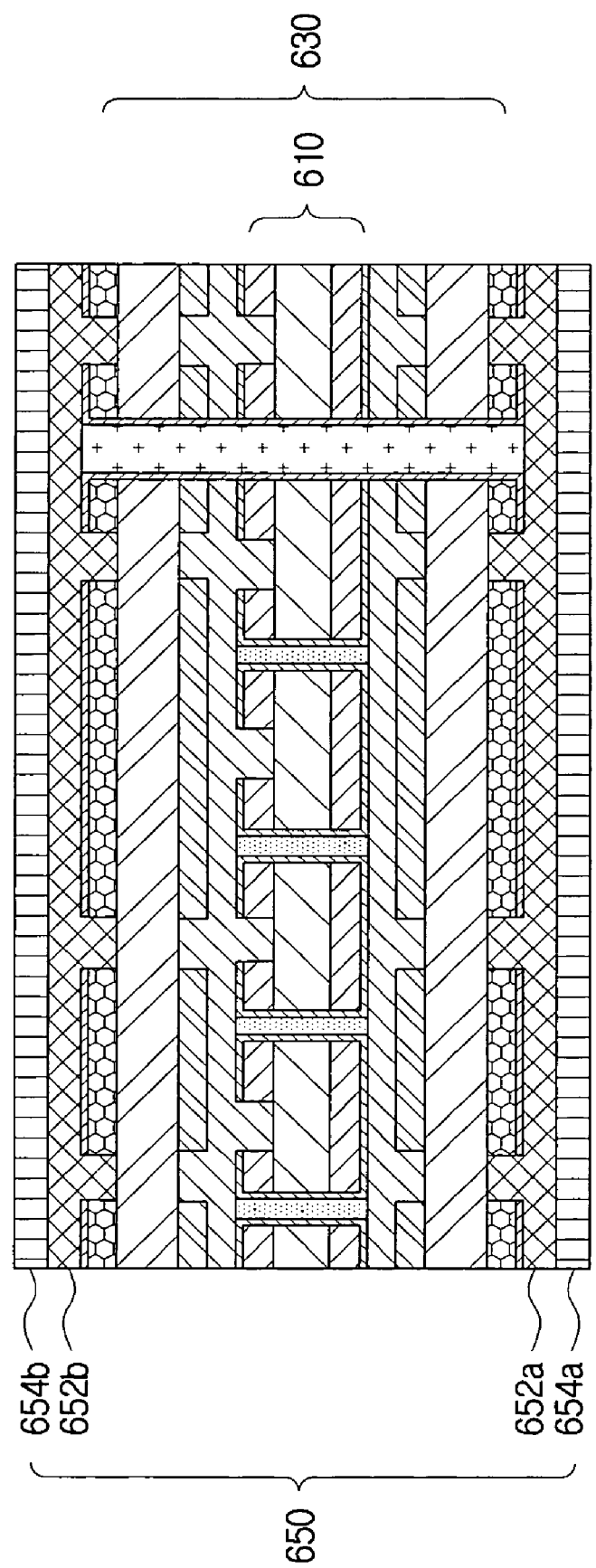
Figure 6K:
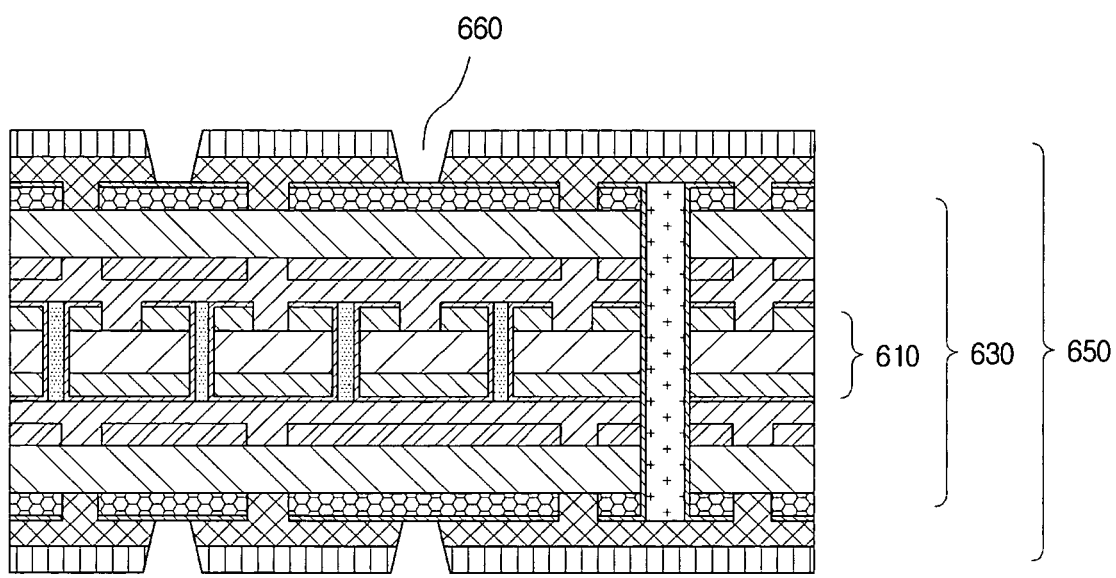
Figure 6L:
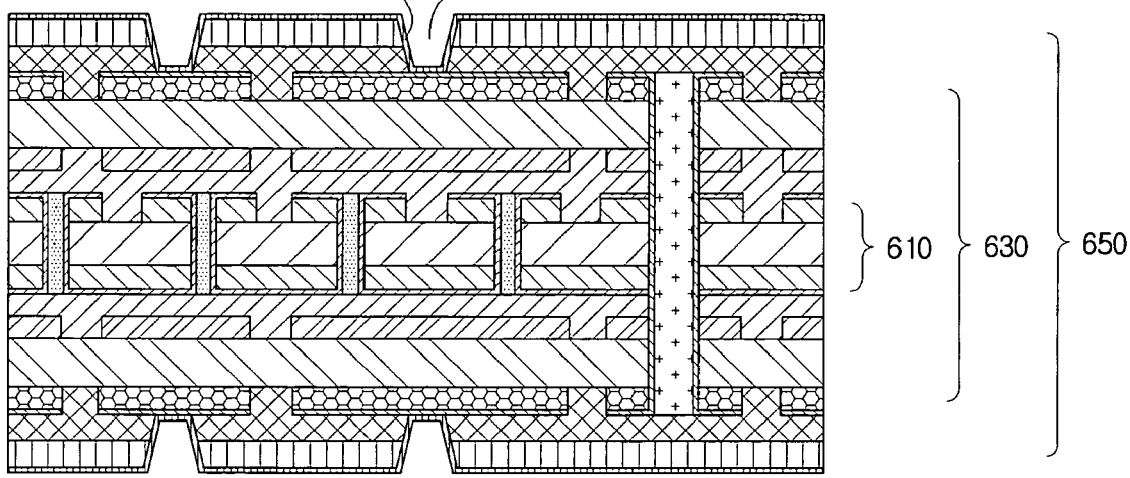

Outer insulated layers 652a and 652b and outer metal layers 654a and 654b are stacked, and an outer circuit is formed (refer to FIG. 6j). A via hole 660 is then made (refer to FIG. 6k). The via hole 660 is formed by laser drilling, and the outer insulated layers 652a and 652b and the outer metal layers 654a and 654b are holed. Through this process, the highest metal layer 638b and/or the lowest metal layer 638a of the multilayer printed circuit board 630 is exposed to outside, and the highest metal layer 638b and/or the lowest metal layer 638a of the multilayer printed circuit board 630 is electrically connected through via hole plating 662 (refer to FIG. 6l).

Figure 6M:
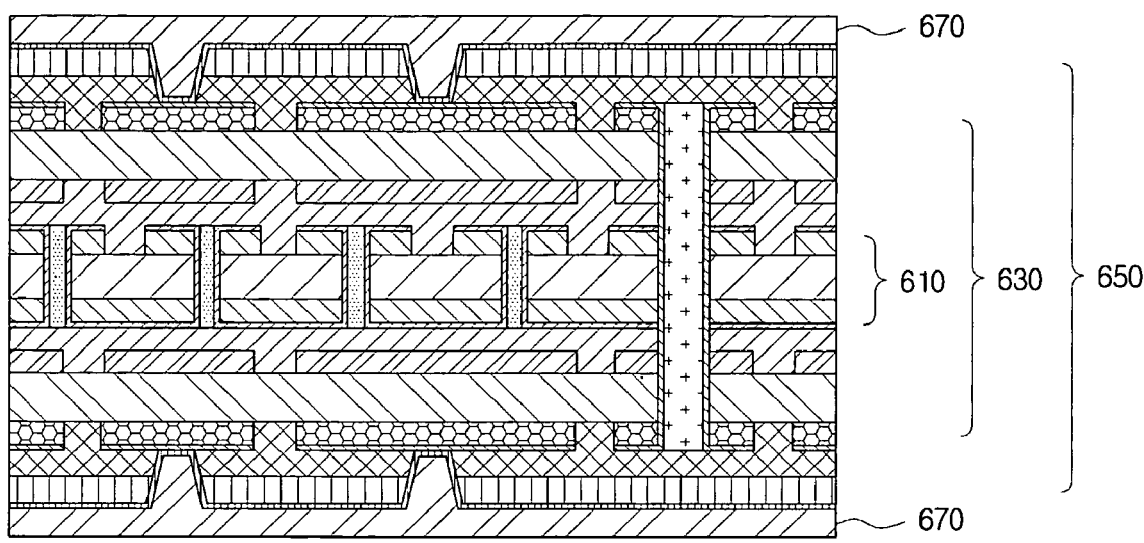

The manufacturing of a printed circuit board is completed by coating a solder resist on the outer most layer (refer to FIG. 6m).

The printed circuit board including the electromagnetic bandgap structure goes through thirteen processes through the above-described process. The manufacturing process of the printed circuit board becomes longer as the inner layer through hole 640 is formed to form an electromagnetic bandgap structure and a process of plating the layer through hole 640 is added.

Therefore, the present invention provides an electromagnetic bandgap structure, a printed circuit board including it and a manufacturing method thereof that solve the mixed signal problem without adding these processes. This will be described more clearly with reference to FIG. 7.

Figure 7:
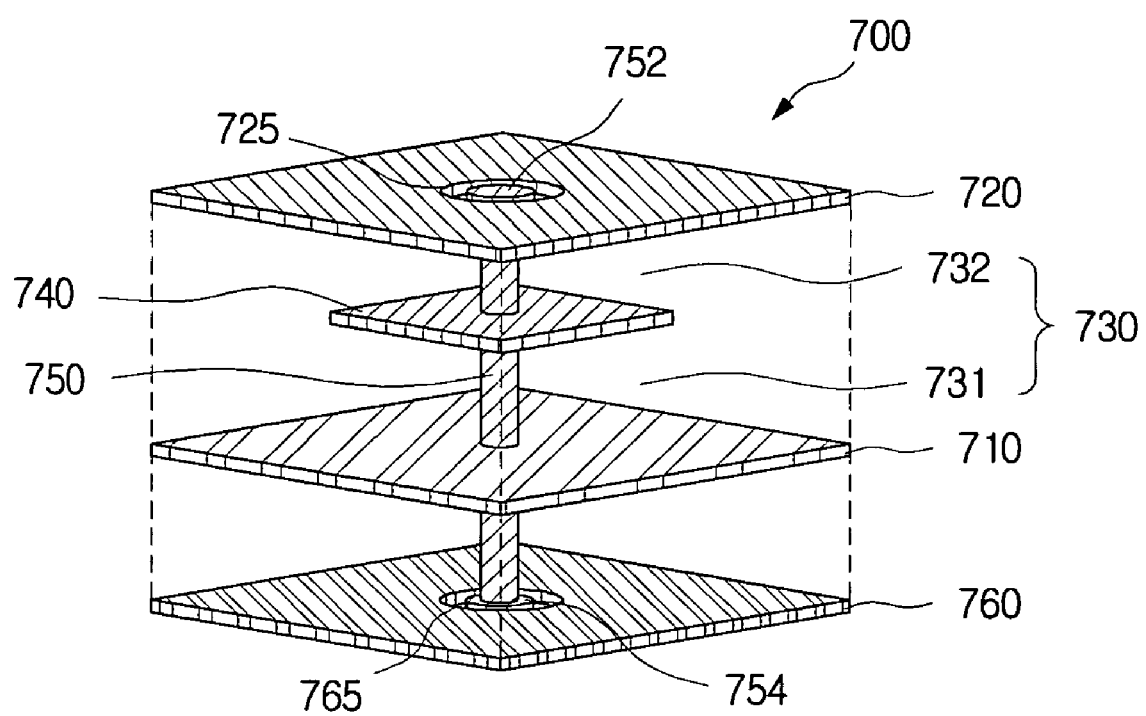
FIG. 7 is a perspective view showing an electromagnetic bandgap structure according to an embodiment of the present invention.

FIG. 7 is a perspective view showing an electromagnetic bandgap structure according to an embodiment of the present invention.

The electromagnetic bandgap structure 700 includes a first metal layer 710, a second metal layer 720, a metal plate 740, a dielectric layer 730 and a via 750.

The metal plate 740 is located between the first metal layer 710 and the second metal layer 720.

The dielectric layer 730 is divided into a first dielectric layer 731 and a second dielectric layer 732 on either side of the metal plate 740, according to time it is formed.

The first metal layer 710, the second metal layer 720, the metal plate 740 and the via 750 are made of metal (e.g. Cu), that can transmit signals by supplying electric power.

The first dielectric layer 731 and the second dielectric layer 732 can be made of the same dielectric material or different dielectric materials that have the same permittivity or that are different from each other.

If the first metal layer 710 is a ground layer, the second metal layer 720 is a power layer, and if the first metal layer 710 is a power layer, the second metal layer 720 is a ground layer. In other words, the first metal layer 710 and the second metal layer 720 are one of the ground layer and the power layer and the other of the ground layer and the power layer, respectively, which are adjacent on ether side of the dielectric layer 730.

The via 750 is extended to both the first metal layer 710 and the second metal layer 720 toward the both sides of the metal plate 740. While the via 750 is coupled to the first metal layer 710, the via 750 is not coupled to the second metal layer 720.

A clearance hole 725 is formed on the second metal layer 720. The clearance hole 725 has the same center as the via 750, and the diameter of the clearance hole 725 is lager than that of the via 750. The clearance hole 725 represents the void in a circuit pattern of the second metal layer 720 that is formed to have a lager diameter than a via land 752 connected to the via 750 on the same planar surface. The via 750 is not connected to the second metal layer 720 because it passes through the clearance hole 725 that is formed on the second metal layer 720.

If the metal plate 740 is a power layer, the via 750 is not connected to a ground layer because it passes through the inner side of the clearance hole 725 formed on the ground layer. Likewise, if the metal plate 740 is a ground layer, the via 750 is not connected to a power layer because it passes through the inner side of the clearance hole 725 formed on the power layer.

Alternatively, the via 750 can be only connected to the metal plate 740 and the first metal layer 710, and not connected any other metal plate by passing through the inner sides of the clearance holes formed on other metal plates.

For example, the third metal layer 760 illustrated in FIG. 7 is located on the opposite side of the metal plate 740 from the first metal layer 710. The third metal layer 760 is also formed with a clearance hole 765, which has the same center as the via 750 and a lager diameter than that of the via 750. The clearance hole 725 is the void in a circuit pattern of the third metal layer 760 formed to have a lager diameter than a via land 754 connected to the via 750 on a same planar surface. The via 750 is not connected to the third metal layer 760 because it passes through the clearance hole 765 formed on the third metal layer 760.

Unlike the via 234 of the electromagnetic gap structure illustrated in FIG. 4, the via 750 in FIG. 7 is not formed between certain layers only but passes through all of the layers, and is connected to the metal plate 740 and the first metal layer 710 only but is not connected to any other metal layer. Therefore, the electromagnetic gap structure in accordance with this embodiment of the present invention can be applied to a printed circuit board without any inner layer drilling process, plating process or filling process. This will be further described with reference to FIGS. 8a to 8j.

FIGS. 8a to 8j are sectional views according to a manufacturing process of a printed circuit board including the electromagnetic bandgap structure according to an embodiment of the present invention. Although an 8-layered printed circuit board is described for the purpose of comparing with the printed circuit board illustrated in FIGS. 6a to 6m, it is apparent that the pertinent description can be applied to various printed circuit boards, including 4- and 6-layered printed circuit boards.

Figure 8A:
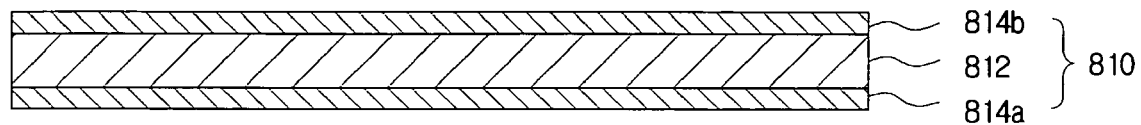
Figure 8B:
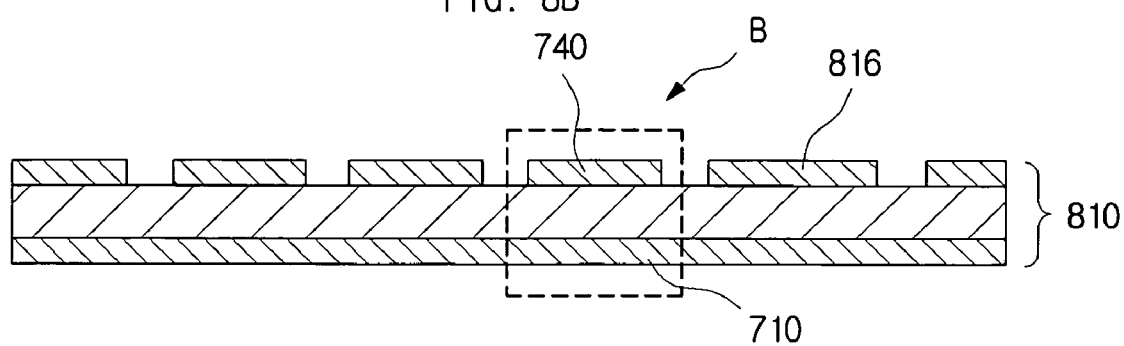

A CCL (cooper clad laminate) 810 is prepared (refer to FIG. 8a). The CCL 810 has cooper films 814a and 814b stacked on both surfaces of an insulated layer 812. Here, it is assumed that the first metal layer 710 of the electromagnetic bandgap structure 700 is formed by a lower copper film 814a, and the metal plate 740 of the electromagnetic bandgap structure 700 is formed by an upper copper film 814b.

A circuit pattern 816 is formed by dry-etching or wet-etching on one surface or both surfaces of the CCL 810 (refer to FIG. 6b). After a part of the cooper film 814b stacked on the CCL 810 is removed, the remaining part performs a function of the circuit pattern 816. At this time, the metal plate 740 of the electromagnetic bandgap structure 700 is also formed (refer to part B).

The forming the circuit pattern 816 and the metal plate 740 are performed through a pattering method, such as masking, etching, exposure to light and developing, of a manufacturing process of the printed circuit board. Since this is a typical process of the printed circuit board that is apparent to anyone skilled in the art, no further detailed description will be provided herein.

A mushroom type structure of the electromagnetic bandgap structure 700 is formed on the inner layer of the printed circuit board, together with an inner layer circuit. The forming a via for forming a complete mushroom type structure will be later performed in FIGS. 8d to 8f.

Figure 8C:
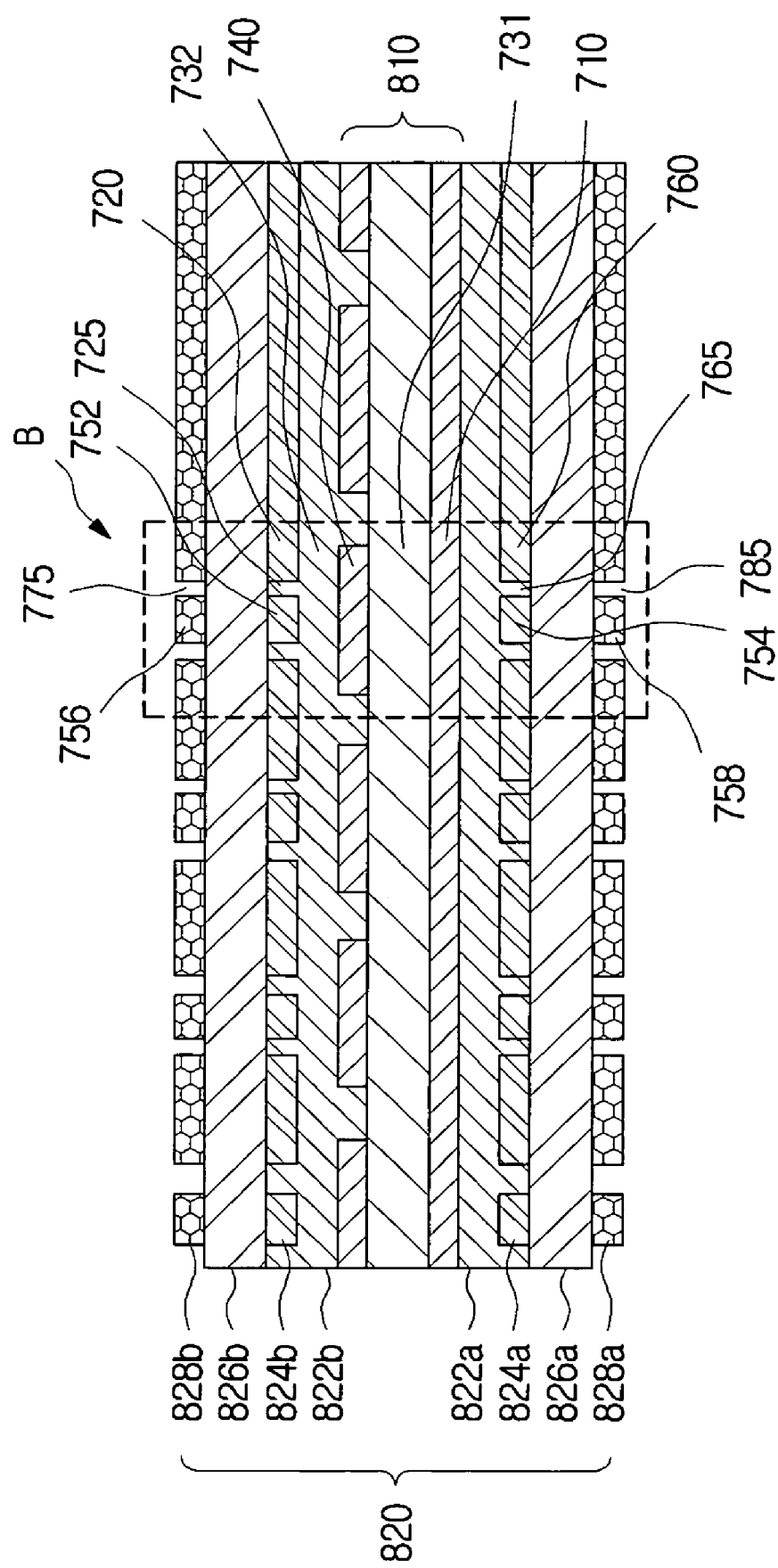

Insulated layers 822a, 822b, 826a and 826b and metal layers 824a, 824b, 828a and 828b are alternately stacked on both surfaces of the inner layer, on which the inner layer circuit and the mushroom type structure are formed, and a circuit pattern is formed on each of the metal layers 824a, 824b, 828a and 828b (refer to FIG. 8c). Moreover, clearance holes 725, 765, 775 and 785 and via lands 752, 754, 756 and 758 are formed (refer to part B) on the location that will be the via 750 of the electromagnetic bandgap structure 700 through the forming of a circuit pattern on each of the metal plates 824a, 824b, 828a and 828b.

Via lands 752, 754, 756 and 758 are connected to through holes. Clearance holes 725, 765, 775 and 785 have the same center as the through holes, and house the via lands 752, 754, 756 and 758 inside and keep the via lands 752, 754, 756 and 758 from being electrically connected to the circuit pattern of each of the metal layers 824a, 824b, 828a and 828b.

This multilayer printed circuit board 820 includes a mushroom type structure inside the part labeled with B and the electromagnetic bandcap structure 700 including the insulated layer 732 and metal layer 720 stacked on the metal plate 740 of the mushroom type structure. The process of forming a via that connects the metal plate 740 and the first metal layer 710, such that the electromagnetic bandgap structure performs the function of solving a mixed signal problem between an analog circuit and a digital circuit, will be illustrated in FIGS. 8d to 8f.

Figure 8D:
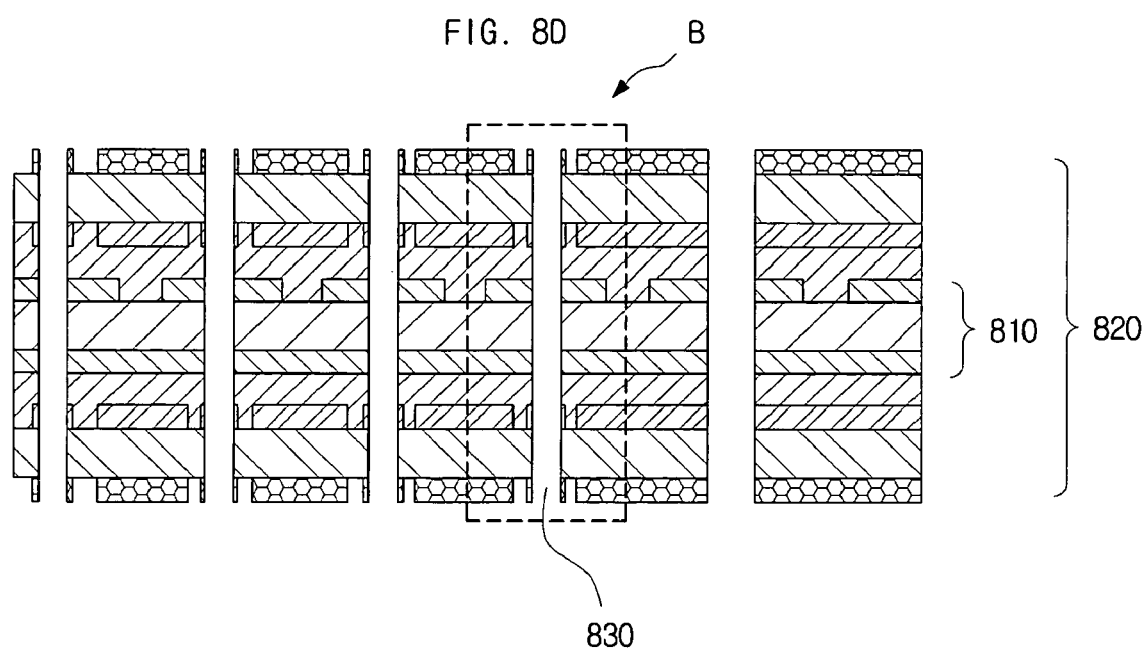
Figure 8E:
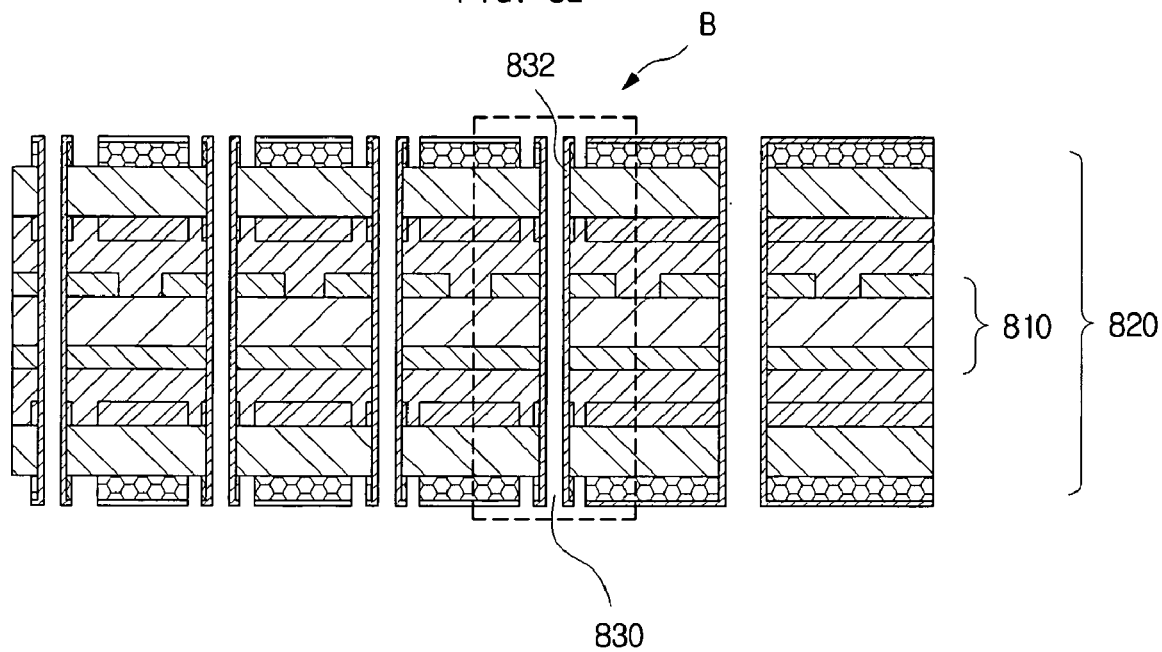
Figure 8F:
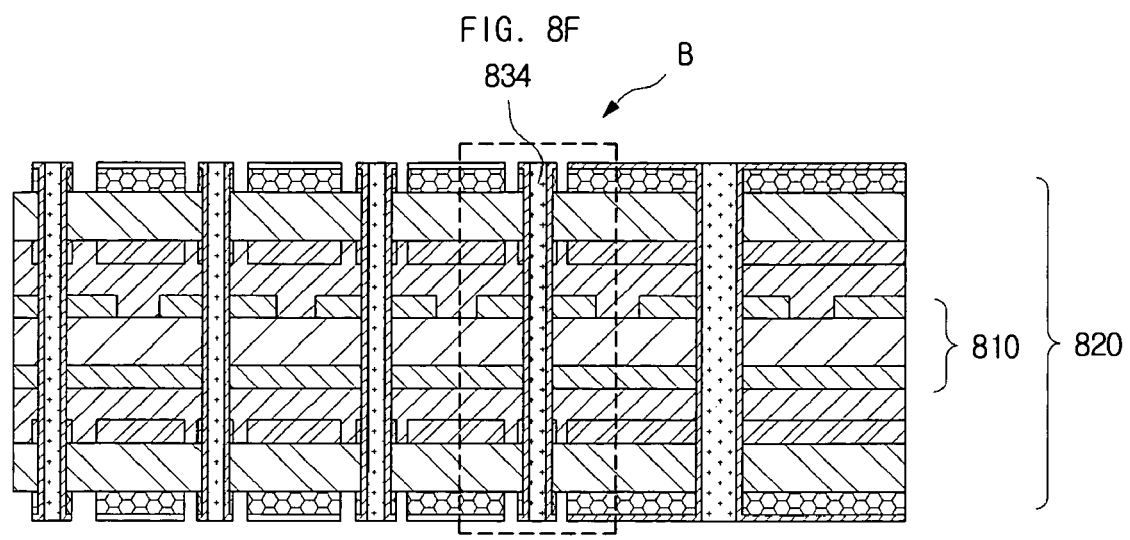
Figure 8G:
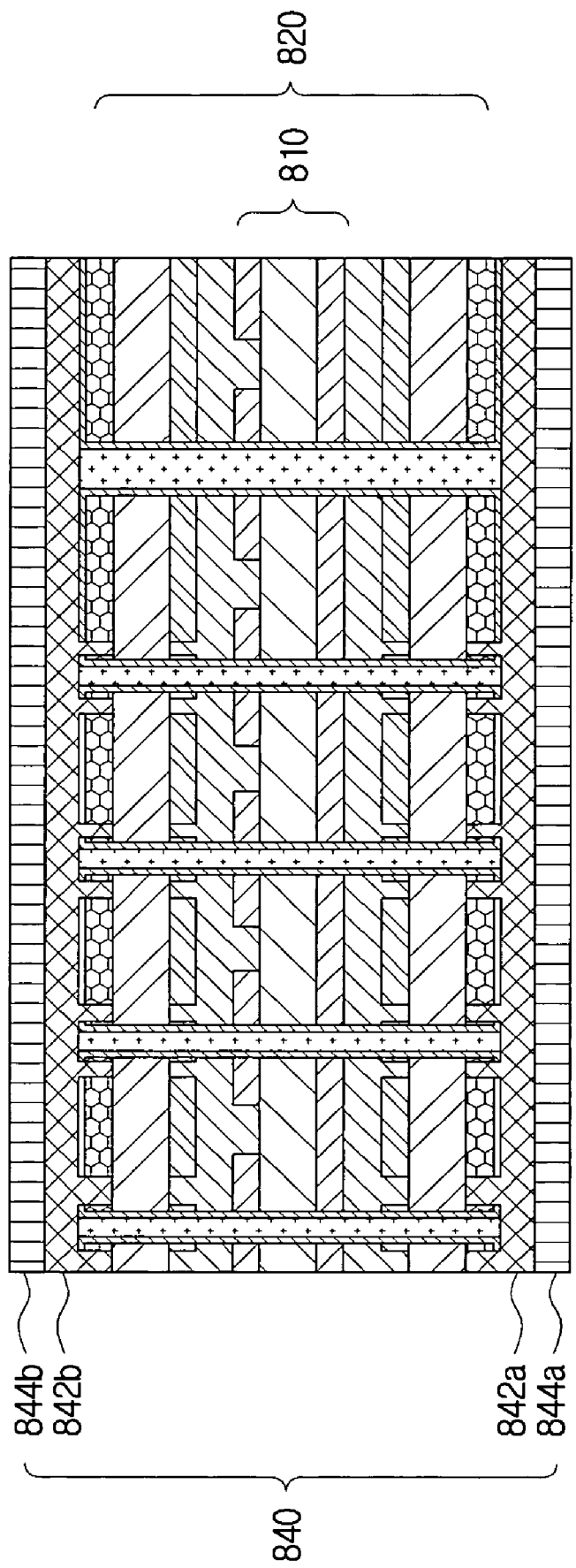

A through hole 830 that passes through the highest metal layer 823b and the lowest metal layer 828a of the multilayer printed circuit board 820 is formed (refer to FIG. 8d). The forming of the through hole 830 is performed by machine drilling, laser drilling and so on.

Here, the through hole 830 forms the via 750 of the electromagnetic bandcap structure 700 and is formed. The via 750 passes through the metal plate 740 formed in FIGS. 8b to 8c, the first metal layer 710 and the via lands 752, 754, 756 and 758 of each metal layer. The through hole 830 is directly connected to the metal plate 740 and the first metal layer 710 but is not connected with other metal layers 824b, 824a, 828b and 828a because it passes through the inside of the clearance holes 725, 765, 775 and 785.

The through hole 830 is plated by electroless cooper plating, electro-cooper plating and so on, and a plated layer 832 is formed (refer to FIG. 8e) on the inner wall. The empty space inside the through hole 830 is filed with, for example, plugging ink 834 and conductive paste (refer to FIG. 8f).

Figure 8H:
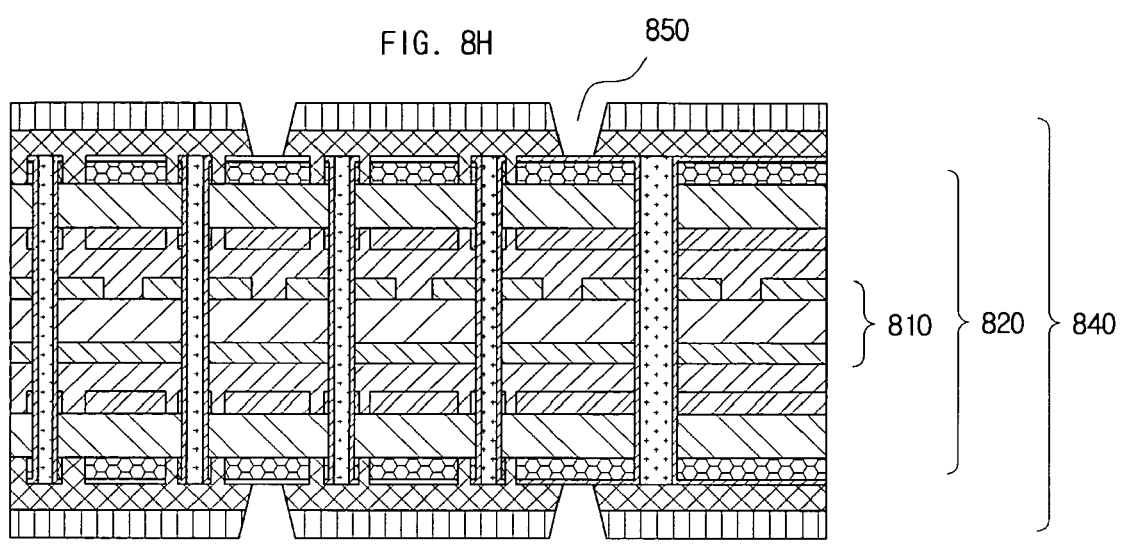
Figure 81:
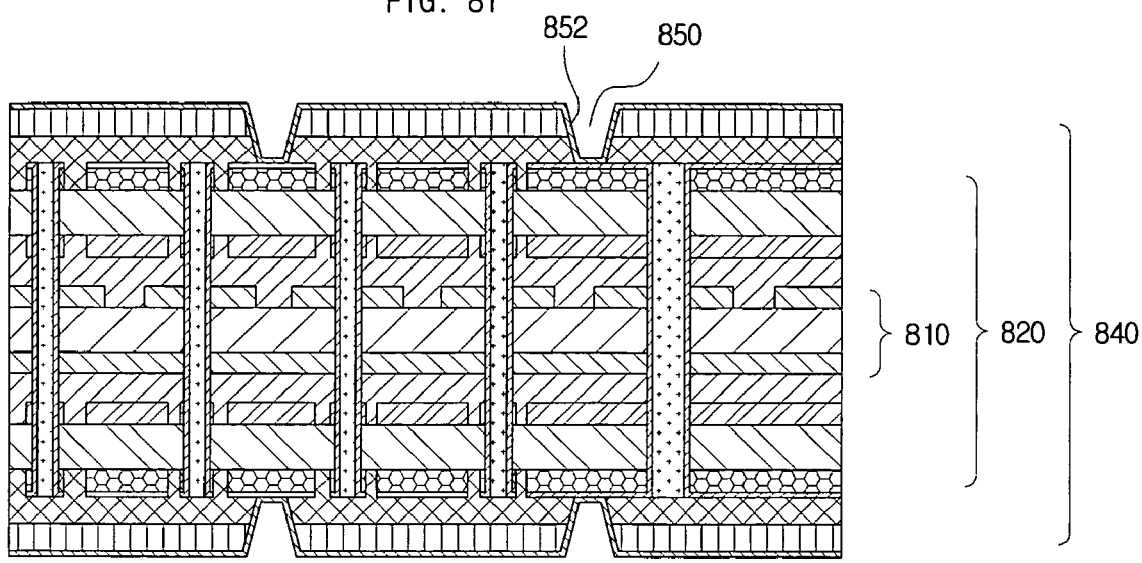
Figure 8J:
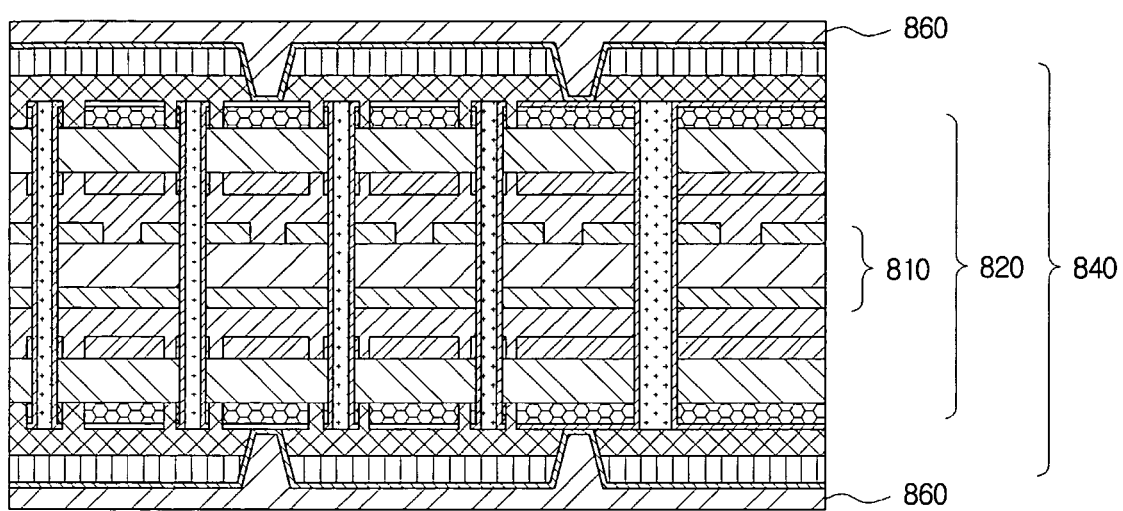

Then, outer insulated layers 842a and 842b and outer metal layers 844a and 844b are stacked to form an outer circuit (refer to FIG. 8g), and a via hole 850 is made (refer to FIG. 8h). The via hole 850 is formed by laser drilling, and the outer insulated layers 842a and 842b and outer metal layers 844a and 844b are holed. Through this process, the highest metal layer 828b and/or the lowest metal layer 828a of the multi-layer printed circuit board 820 is exposed to the outside, and the highest metal layer 828b and/or the lowest metal layer 828a of the multilayer printed circuit board 820 is electrically connected through the via hole plating process (refer to FIG.

8*i*). Then, the manufacturing of the printed circuit board is completed by coating a solder resist 860 on the outer most layer (refer to FIG. 8*j*).

The process shown in FIGS. 8*g* to 8*j* is the same as that of FIGS. 6*j* to 6*m*.

Through the process described above, the printed circuit board including the electromagnetic bandgap structure goes through ten processes, which is 3 processes less than the manufacturing process of the printed circuit board illustrated in FIGS. 6*a* to 6*m*. This is because the drilling process of the inner layer, plating process and filling process are eliminated by using a through hole instead of forming an inner layer through hole.

Although the via land being located inside the clearance hole has been described in an embodiment of the present invention, it is possible that only the via, without a via land, passes through the inside of the clearance hole.

Because the electromagnetic bandgap structure 700 in accordance with an embodiment of the present invention is located inside, the printed circuit board that is used by implementing an analog circuit and a digital circuit at the same time can prevent electromagnetic waves of a certain frequency range (for example, 0.8~2.0 GHz) from being transmitted from the digital circuit to the analog circuit.

Therefore, despite the compact size, the mixed signal problem described above can be solved by preventing the transmission of electromagnetic waves of a certain frequency range that correspond to noise of an RF circuit.

Hitherto, although some embodiments of the present invention have been shown and described, it will be appreciated by any person of ordinary skill in the art that a large number of modifications, permutations and additions are possible within the principles and spirit of the invention, the scope of which shall be defined by the appended claims and their equivalents.

What is claimed is:

1. An electromagnetic bandgap structure, comprising:
    a first metal layer;
    a first dielectric layer, stacked on the first metal layer;
    a metal plate, stacked on the first dielectric layer;
    a second dielectric layer, stacked on the metal plate and the first dielectric layer;
    a second metal layer, stacked on the second dielectric layer;
    a via, directed from the metal plate to the first metal layer and the second metal layer; and
    at least one metal layer outside the first metal layer and the second metal layer,
    wherein the via is connected to the first metal layer and is not connected to the second metal layer, and is extended to the at least one metal layer and passes through the inside of a clearance hole formed on the at least one metal layer.

2. The electromagnetic bandgap structure of claim 1, wherein the second metal layer comprises a clearance hole that has a same center as the via and has a lager diameter than the via.

3. The electromagnetic bandgap structure of claim 2, wherein the via is connected to a via land on a same planar surface as the second metal layer and the clearance hole houses the via land.

4. A printed circuit board having an analog circuit and a digital circuit, the printed circuit board in which an electromagnetic bandgap structure is disposed between the analog circuit and the digital circuit, the electromagnetic bandgap structure comprising:
    a first metal layer;
    a first dielectric layer, stacked on the first metal layer;
    a metal plate, stacked on the first dielectric layer;
    a second dielectric layer, stacked on the metal plate and the first dielectric layer;
    a second metal layer, stacked on the second dielectric layer;
    a via, directed from the metal plate to the first metal layer and the second metal layer; and
    at least one metal layer outside the first metal layer and the second metal layer,
    wherein the via is connected to the first metal layer and is not connected the second metal layer, and is extended to the at least one metal layer and passes through the inside of a clearance hole formed on the at least one metal layer.

5. The printed circuit board of claim 4, wherein the first metal layer is any one of a ground layer and a power layer, and the second metal layer is the other of the ground layer and the power layer.

6. The printed circuit board of claim 4, wherein the analog circuit is an RF circuit receiving a wireless signal from the outside.

7. The printed circuit board of claim 4, wherein the second metal layer comprises a clearance hole that has a same center as the via and has a lager diameter than the via.

8. The printed circuit board of claim 7, wherein the via is connected to a via land on a same planar surface as the second metal layer and the clearance hole houses the via land.

* * * * *

UNITED STATES PATENT AND TRADEMARK OFFICE
CERTIFICATE OF CORRECTION

PATENT NO.       : 8,183,468 B2
APPLICATION NO.  : 12/216629
DATED            : May 22, 2012
INVENTOR(S)      : Han Kim et al.

It is certified that error appears in the above-identified patent and that said Letters Patent is hereby corrected as shown below:

Title Page Column 2 (Abstract), Line 13, After "connected" insert -- to --.

Column 10, Line 30, In Claim 4, After "connected" insert -- to --.

Signed and Sealed this
Twenty-eighth Day of August, 2012

David J. Kappos
*Director of the United States Patent and Trademark Office*